(12) United States Patent
Yamamoto

(10) Patent No.: US 6,368,913 B1
(45) Date of Patent: Apr. 9, 2002

(54) METHOD OF MANUFACTURING A SEMICONDUCTOR DEVICE AND A SEMICONDUCTOR DEVICE

(75) Inventor: Ichiro Yamamoto, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/471,612

(22) Filed: Dec. 23, 1999

(30) Foreign Application Priority Data

Dec. 24, 1998 (JP) .......................................... 10-366875

(51) Int. Cl.[7] .......................................... H01L 21/8242
(52) U.S. Cl. ........................ 438/255; 438/398; 438/964
(58) Field of Search ................................. 438/255, 398, 438/964

(56) References Cited

U.S. PATENT DOCUMENTS

| | | | |
|---|---|---|---|
| 5,656,531 A | * | 8/1997 | Thakur et al. ............... 438/398 |
| 5,885,867 A | * | 3/1999 | Shin et al. .................. 438/255 |
| 5,937,314 A | * | 8/1999 | Ping et al. .................. 438/486 |
| 6,046,084 A | * | 4/2000 | Wei et al. ................... 438/255 |
| 6,146,967 A | * | 11/2000 | Thakur et al. ............... 438/398 |

FOREIGN PATENT DOCUMENTS

| | | |
|---|---|---|
| JP | 09-167833 | 6/1997 |
| JP | 09-191092 | 7/1997 |
| JP | 09-298284 | 11/1997 |
| JP | 10-022473 | 1/1998 |
| JP | 10-022474 | 1/1998 |
| JP | 10-144880 | 5/1998 |
| JP | 10-209397 | 8/1998 |
| JP | 10-275902 | 10/1998 |
| KR | 0155903 | 7/1998 |

OTHER PUBLICATIONS

Japanese Office Action, dated Apr. 13, 2001, with English language translation of Japanese Examiner's comments.
H. Watanabe, et al., "Hemispherical Grained Si Formation on in–situ Phosphorus Dopes Amorphous–Si Electrode for 256 Mb Dram's Capacitor" IEEE Translations on Electron Devices, vol. 42, No. 7, Jul. 1995, p. 1247–1254.

* cited by examiner

*Primary Examiner*—John F. Niebling
*Assistant Examiner*—Jennifer M. Kennedy
(74) *Attorney, Agent, or Firm*—Whitham, Curtis & Christofferson, P.C.

(57) ABSTRACT

A method of manufacturing a semiconductor device such as a DRAM device having a capacitor. The capacitor has an electrode having an HSG structure. The electrode is formed by: forming a cylinder type electrode body which is made of amorphous silicon and which has at least an inner wall surface and an outer wall surface, the forming a cylinder type electrode body comprises at least forming an amorphous silicon film by using a thermal CVD method; and by forming hemispherical grain (HSG) at least at the inner wall surface and at the outer wall surface of the cylinder type electrode body to form a hemispherically grained cylinder type electrode. When the amorphous silicon film is formed by using a thermal CVD method, at least an initial growth temperature of the amorphous silicon film is controlled to be within a range from 450 to 520 degrees Celsius.

8 Claims, 7 Drawing Sheets

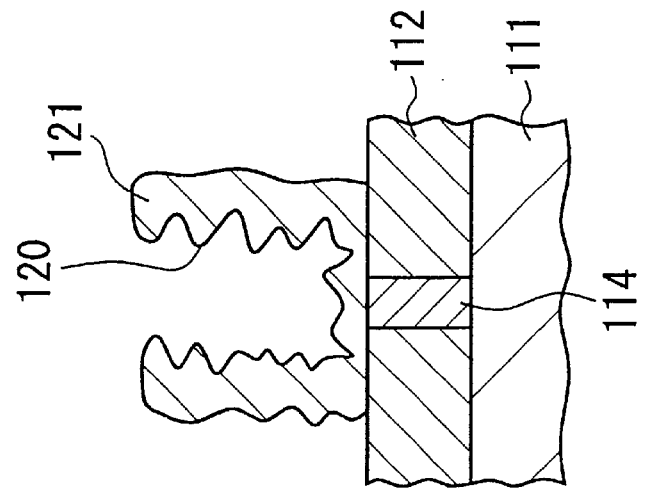
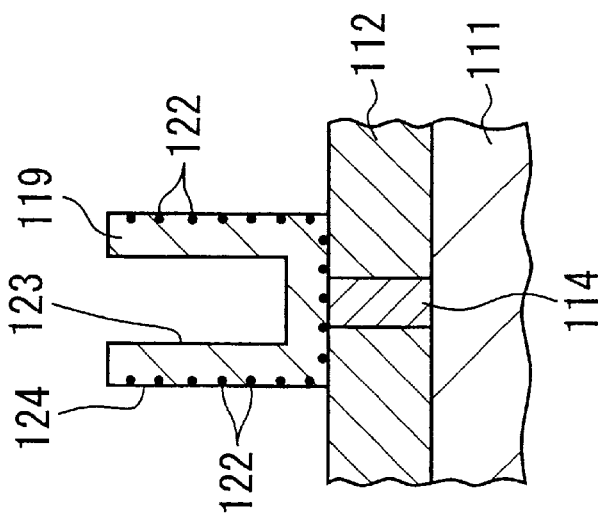
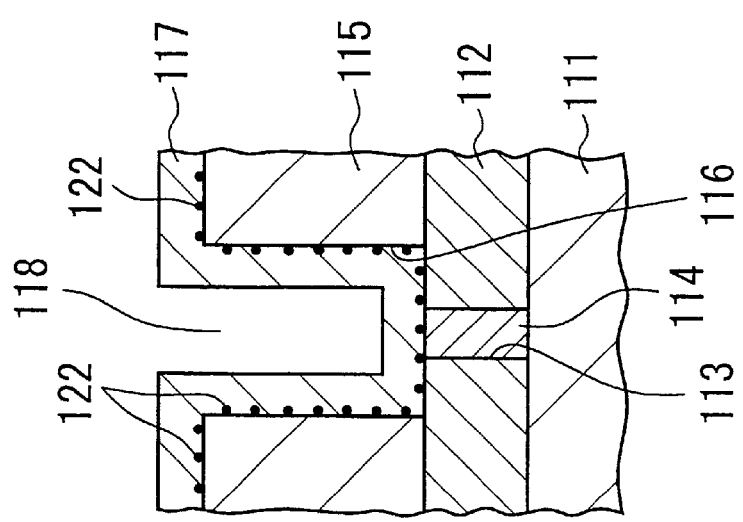

METHOD OF MANUFACTURING A SEMICONDUCTOR DEVICE AND A SEMICONDUCTOR DEVICE

FIELD OF THE INVENTION

The present invention relates generally to a method of manufacturing a semiconductor device and a semiconductor device manufactured by the method. More particularly, the present invention relates to an improved method of manufacturing a semiconductor device including capacitors, such as a DRAM (Dynamic Random Access Memory) device, and the like, in which each capacitor comprises a lower electrode having an HSG structure (Hemispherically Grained Structure) to increase electrostatic capacitance of the capacitor. The present invention also relates to a semiconductor device manufactured by such an improved method.

BACKGROUND OF THE INVENTION

In a semiconductor device including capacitors, such as a DRAM device and the like, it is required that each of the capacitors has relatively large capacitance while occupying a small area in the semiconductor device. In order to increase the capacitance of the capacitor, various structures of the capacitor and, especially, various structures and shapes of a capacitor electrode are devised.

FIG. 6A through FIG. 6C are cross sectional views schematically showing various structures of a lower or inner electrode of a capacitor used in the DRAM device and the like. In each of FIGS. 6A through 6C, there is formed an interlayer insulating film 112 on a silicon substrate 111. In the interlayer insulating film 112, there is formed an opening 113, and the opening 113 is filled with a contact plug portion 114 made of conductive material. The lower electrodes 101 through 103, which have various shapes as shown in FIGS. 6A through 6C, respectively, are formed on the interlayer insulating film 112 such that the lower electrodes 101 through 103 are electrically coupled with the contact plug portion 114. Although not shown in the drawings, an upper or outer capacitor electrode is formed via an insulating film on the surface of each of these lower electrodes 101 through 103, thereby a capacitor is formed.

A box type or a simple stack type electrode 101 shown in FIG. 6A has a simple structure and is easy to manufacture. However, this structure has a disadvantage that the capacitance of the capacitor using the simple stack type electrode 101 is relatively small.

A cylinder type or a crown type electrode shown in FIG. 6B has a structure which is a little more complex than that of the simple stack type electrode 101 shown in FIG. 6A. However, this electrode has a larger electrode area than that of the simple stack type electrode 101 shown in FIG. 6A. Therefore, capacitance of the capacitor using the cylinder type electrode 102 can be approximately twice the capacitance of the capacitor using the simple stack type electrode 101.

In order to further increase the capacitance of the capacitor, there is known an HSG cylinder (hemispherically grained cylinder) type electrode which is fabricated by forming HSG (hemispherical grain) or an HSG layer (hemispherically grained layer) on or at a surface of the cylinder type electrode. FIG. 6C illustrates an HSG cylinder type electrode 103 having an ideal HSG structure. In the HSG cylinder type electrode 103, the area of the electrode is increased by the HSG layer formed at the surface thereof. The capacitance of the capacitor using the ideal HSG cylinder type electrode 103 is expected to become approximately 3.5 through 4 times of that of the capacitor using the simple stack type electrode 101. A method of growing the HSG layer at a cylinder type structure is disclosed, for example, in Japanese patent laid-open publication No. 9-167833.

However, in the prior art method of fabricating an HSG cylinder type electrode 103, it was difficult to properly grow the HSG both at an inner wall portion and at an outer wall portion of the cylinder type structure.

FIG. 7A through FIG. 7C illustrate schematic cross sectional structures at various stages, in order of process steps, during a conventional process of fabricating an HSG cylinder type electrode.

As shown in FIG. 7A, an interlayer insulating film 112, such as an oxide film and the like, is formed on a silicon substrate 111. Thereafter, by using, for example, photolithography and etching, the interlayer insulating film 112 is selectively removed and a contact opening 113 is formed. The contact opening 113 is filled with doped polysilicon or doped amorphous silicon and thereby a contact plug 114 is formed.

Thereafter, on the contact plug 114 and on the interlayer insulating film 112, a relatively thick silicon oxide film 115 is formed. Then, by using, for example, photolithography and etching, the silicon oxide film 115 is selectively removed and thereby an opening 116 is formed. In this condition, the top surface of the contact plug 114 is exposed via the opening 116 and at the bottom of the opening 116. Next, a relatively thin phosphorus doped amorphous silicon film 117 is formed inside the opening 116, i.e., on the inside bottom surface and on an inner side wall of the opening 116, and on the silicon oxide film 115, by using a thermal CVD method. Conventionally, taking the deposition rate or growth rate of a phosphorus doped amorphous silicon film into consideration, a deposition temperature or a growth temperature of the phosphorus doped amorphous silicon film of approximately 530 through 550 degrees Celsius is used in general. Thereby, the structure shown in FIG. 7A is obtained.

Thereafter, a recessed portion or trench 118 formed by the portion of the phosphorus doped amorphous silicon film 117 along the opening 116 is filled with coating glass not shown in the drawing. The phosphorus doped amorphous silicon film 117 is etched back. Then, the coating glass not shown in the drawing and the silicon oxide film 115 are removed by etching. Thereby, as shown in FIG. 7B, a cylinder structure 119 made of the remainder of the phosphorus doped amorphous silicon film 117 can be obtained.

The substrate having the structure of FIG. 7B is loaded into an HSG forming apparatus not shown in the drawing. The atmosphere around the substrate is depressurized, and silane gas is introduced around the substrate. Thereafter, the atmosphere around the substrate is evacuated and the substrate is heat treated. Thereby, HSG or an HSG layer 120 is grown at the surface of the cylinder 119. As a result, an HSG cylinder type electrode 121 is fabricated as shown in FIG. 7C.

However, as schematically shown in FIG. 7C, in the HSG cylinder type electrode 121 actually fabricated, at the inside wall surface, the HSG having an approximately expected shape is formed, but, at the outside wall surface, the HSG grows too much and unevenness becomes relatively small. Therefore, the outer wall surface of the HSG cylinder type electrode 121 actually fabricated by the conventional method becomes smoother than the inner wall surface.

The inventor of the present invention inspected the causes for such phenomenon, and found that the causes are as follows.

As shown schematically in FIG. 7A, when the phosphorus doped amorphous silicon film 117 is formed by using the thermal CVD method, crystalline nuclei 122 are produced in the phosphorus doped amorphous silicon film 117 near the interface between the phosphorus doped amorphous silicon film 117 and the silicon oxide film 112 and between the phosphorus doped amorphous silicon film 117 and the silicon oxide film 115. Portions of the nuclei 122 are not removed at the etching process thereafter and are left in the phosphorus doped amorphous silicon oxide film 117. Therefore, as shown schematically in FIG. 7B, the nuclei exist in the bottom surface portion and the outer wall portion 124 of the cylinder 119, and do not exist in the inner wall portion 123 of the cylinder 119. In the process of growing the HSG thereafter, the HSG grows preferentially from the nuclei 122 existing in the outer wall portion 124 of the cylinder 117. Therefore, it is considered that, in the finally fabricated HSG cylinder type electrode 121, forms of the fabricated HSG differ between the inner wall portion and the outer wall portion of the cylinder.

That is, when the substrate is loaded into an HSG forming apparatus and silane gas is introduced into the HSG forming apparatus, each of the hemispherical portions has already started to grow from each of the nuclei 122 existing in the outer wall portion of the cylinder 119. Also, during a process of heat treatment of the substrate to grow the HSG, the hemispherical portions grow faster at the outer wall portion 124 of the cylinder 119 than at the inner wall portion 123 of the cylinder 119. The condition of the process of growing the HSG is determined such that the HSG grows most appropriately at the inner wall portion of the cylinder 119. Therefore, when the ideal HSG is formed at the inner wall portion 123 of the cylinder 119, the HSG is overgrown at the outer wall portion of the cylinder 119. Each of the hemispherical portions of the HSG layer grown at the outer wall portion 124 of the cylinder 119 become relatively large, and therefore adjacent hemispherical portions are often joined to each other. Thus, the outer wall surface of the HSG cylinder type electrode 121 actually fabricated has smaller unevenness than that of the inner wall surface, and becomes smoother than the inner surface. As a result, by forming the HSG layer, a surface area of the inner wall surface of the HSG cylinder type electrode 121 increases considerably, but a surface area of the outer wall surface of the HSG cylinder type electrode 121 does not increase so much.

In practice, the capacitance of the capacitor using the HSG cylinder type electrode 121 fabricated by using the conventional method only becomes approximately 2.6 through 3.0 times the capacitance of the capacitor using the simple stack type electrode 101. It was impossible to obtain the capacitance value expected from the ideal HSG cylinder type electrode 103, that is, the capacitance value approximately 3.5 through 4.0 times the capacitance of capacitor using the simple stack type electrode 101.

SUMMARY OF THE INVENTION

Considering the above-mentioned disadvantages of the prior art, it is an object of the present invention to provide a semiconductor device and a method of manufacturing the semiconductor device in which an ideal HSG structure can be fabricated.

It is another object of the present invention to provide a semiconductor device and a method of manufacturing the semiconductor device in which formation of an abnormal and unexpected HSG structure caused by nuclei produced when a doped amorphous silicon film is formed can be suppressed.

It is still another object of the present invention to provide a semiconductor device and a method of manufacturing the semiconductor device in which a preferable HSG structure can be formed both at the inner wall portion and at the outer wall portion of the cylinder type doped amorphous silicon electrode body.

It is still another object of the present invention to provide a semiconductor device and a method of manufacturing the semiconductor device in which a preferable HSG structure can be formed both at the inner wall portion and at the outer wall portion of the cylinder type doped amorphous silicon electrode body and in which capacitance of the capacitor constituted using the HSG structure can be increased.

It is still another object of the present invention to provide a semiconductor device and a method of manufacturing the semiconductor device in which a preferable HSG structure can be formed both at the inner wall portion and at the outer wall portion of the cylinder type doped amorphous silicon electrode body, and in which deterioration of throughput of manufacturing the semiconductor device can be avoided.

According to an aspect of the present invention, there is provided a method of manufacturing a semiconductor device comprising: forming a cylinder type electrode body which is made of amorphous silicon and which has at least an inner wall surface and an outer wall surface, the forming a cylinder type electrode body comprises at least forming an amorphous silicon film by using a thermal CVD method while controlling at least an initial growth temperature of the amorphous silicon film to be within a range from 450 to 520 degrees Celsius; and forming hemispherical grain (HSG) at least at the inner wall surface and at the outer wall surface of the cylinder type electrode body to form a hemispherically grained cylinder type electrode.

In this case, the HSG cylinder type electrode may be a lower or inner electrode of a capacitor.

It is preferable that the amorphous silicon film is a doped amorphous silicon film.

It is also preferable that, in the forming the amorphous silicon film by using a thermal CVD method, at least monosilane ($SiH_4$) is used.

It is further preferable that, in the forming the amorphous silicon film by using a thermal CVD method, monosilane ($SiH_4$) and phosphine ($PH_3$) are used.

It is also preferable that, in the forming the amorphous silicon film by using a thermal CVD method, at least disilane ($Si_2H_6$) is used.

It is also preferable that, in the forming the amorphous silicon film by using a thermal CVD method, disilane ($Si_2H_6$) and phosphine ($PH_3$) are used.

It is possible, in the forming the amorphous silicon film by using a thermal CVD method, to control the growth temperature of the amorphous silicon film to be always within a range from 450 to 520 degrees Celsius.

According to another aspect of the present invention, there is provided a method of manufacturing a semiconductor device comprising: forming a cylinder type electrode body which is made of amorphous silicon and which has at least an inner wall surface and an outer wall surface, the forming a cylinder type electrode body comprises at least a first step of forming a first amorphous silicon film by using a thermal CVD method and a second step of forming a second amorphous silicon film on the first amorphous silicon film by using a thermal CVD method, wherein the growth temperature of the first amorphous silicon film in the first step is lower than the growth temperature of the second amorphous silicon film in the second step; and forming hemispherical grain (HSG) at least at the inner wall surface and at the outer wall surface of the cylinder type electrode body to form a hemispherically grained cylinder type electrode.

In this case, the HSG cylinder type electrode may be a lower or inner electrode of a capacitor.

It is preferable that, in the first step, the growth temperature of the first amorphous silicon film is controlled to be within a range from 450 to 520 degrees Celsius, and, in the second step, the growth temperature of the second amorphous silicon film is controlled to be a temperature higher than 520 degrees Celsius.

It is also preferable that the first and second amorphous silicon films are doped amorphous silicon films.

It is also preferable that the second step is performed substantially continuously after the first step.

It is further preferable that, in the first step, the first amorphous silicon film is formed by using a thermal CVD method which uses at least disilane ($Si_2H_6$), and, in the second step, the second amorphous silicon film is formed on the first amorphous silicon film by using a thermal CVD method which uses at least monosilane ($SiH_4$).

It is still further preferable that, in the first step, the first amorphous silicon film is formed by using a thermal CVD method which uses disilane ($Si_2H_6$) and phosphine ($PH_3$), and, in the second step, the second amorphous silicon film is formed on the first amorphous silicon film by using a thermal CVD method which uses monosilane ($SiH_4$) and phosphine ($PH_3$).

It is preferable that, in the first step, the first amorphous silicon film is formed by using a thermal CVD method which uses monosilane ($SiH_4$) and phosphine ($PH_3$), and, in the second step, the second amorphous silicon film is formed on the first amorphous silicon film by using a thermal CVD method which uses monosilane ($SiH_4$) and phosphine ($PH_3$).

It is further preferable that the first amorphous silicon film is thinner than the second amorphous silicon film.

According to still another aspect of the present invention, there is provided a method of manufacturing a semiconductor device comprising: preparing a semiconductor substrate; forming a first insulating film on the semiconductor substrate; forming a first opening in the first insulating film; filling the first opening with an electrically conductive material; forming a second insulating film on the first insulating film and on a portion of the electrically conductive material filling the first opening; selectively removing the second insulating film and forming a second opening, wherein the top surface of the portion of the electrically conductive material filling the first opening is exposed through the second opening; forming a doped amorphous silicon film on the second insulating film and on a side wall surface and a bottom surface of the second opening by using a thermal CVD method, while controlling at least an initial growth temperature of the doped amorphous silicon film to be within a range from 450 through 520 degrees Celsius; filling a recessed portion surrounded by a portion of the doped amorphous silicon film formed along the second opening with a masking material; etching back the doped amorphous silicon film; removing the second insulating film and the masking material filling the recessed portion surrounded by the doped amorphous silicon; and forming hemispherical grain (HSG) at least at an inner wall surface and at an outer wall surface of the doped amorphous silicon film which is left and which has a cylindrical shape to form an HSG cylinder type electrode.

In this case, it is preferable that the forming a doped amorphous silicon film by using a thermal CVD method comprises a first step of forming a first doped amorphous silicon film by using a thermal CVD method and a second step of forming a second doped amorphous silicon film on the first doped amorphous silicon film by using a thermal CVD method, and wherein, in the first step, the growth temperature of the first doped amorphous silicon film is controlled to be within a range from 450 to 520 degrees Celsius, and, in the second step, the growth temperature of the second doped amorphous silicon film is controlled to be a temperature higher than 520 degrees Celsius.

According to still another aspect of the present invention, there is provided a semiconductor device comprising an HSG cylinder type electrode, the HSG cylinder type electrode is fabricated by: forming a cylinder type electrode body which is made of amorphous silicon and which has at least an inner wall surface and an outer wall surface, the forming a cylinder type electrode body comprises at least forming an amorphous silicon film by using a thermal CVD method while controlling at least an initial growth temperature of the amorphous silicon film to be within a range from 450 to 520 degrees Celsius; and forming hemispherical grain (HSG) at least at the inner wall surface and at the outer wall surface of the cylinder type electrode body to form a hemispherically grained cylinder type electrode.

BRIEF DESCRIPTION OF THE DRAWINGS

These and other features, and advantages, of the present invention will be more clearly understood from the following detailed description taken in conjunction with the accompanying drawings, in which like reference numerals designate identical or corresponding parts throughout the figures, and in which:

FIG. 7A is a partial cross sectional view illustrating a cross sectional structure of a capacitor portion of a semiconductor device obtained during a conventional manufacturing process;

FIG. 7B is a partial cross sectional view illustrating another cross sectional structure of a capacitor portion of a semiconductor device obtained, after the structure of FIG. 7A, during a conventional manufacturing process; and FIG. 7C is a partial cross sectional view illustrating still another cross sectional structure of a capacitor portion of a semiconductor device obtained, after the structure of FIG. 7B, during a conventional manufacturing process.

DESCRIPTION OF A PREFERRED EMBODIMENT

With reference to the drawings, embodiments of the present invention will now be described.

FIGS. 1 through 5 illustrate, in order of process steps, schematic cross sectional structures obtained during a manufacturing process of a semiconductor device according to an embodiment of the present invention. FIGS. 1 through 5 only show cross sectional structures of a capacitor portion of the semiconductor device during the manufacturing process.

Figure 1:
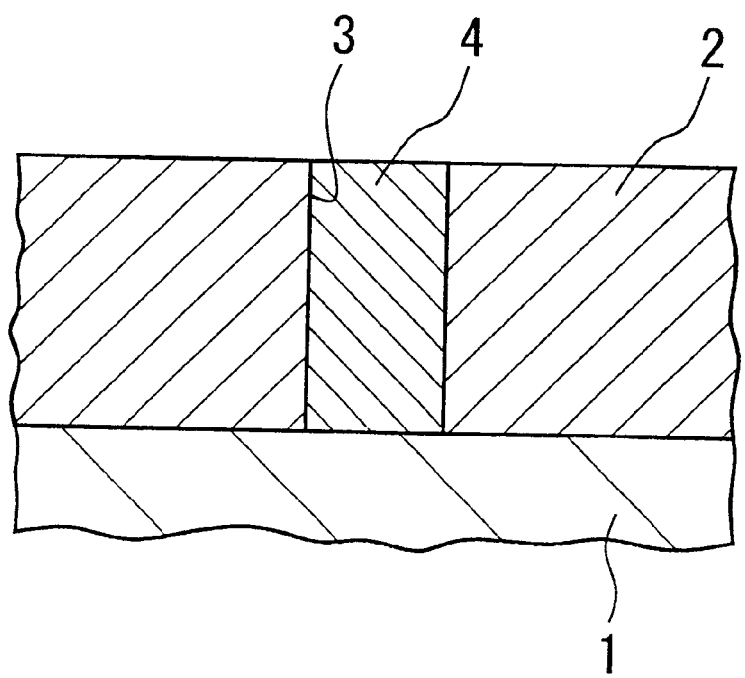
FIG. 1 is a partial cross sectional view illustrating a cross sectional structure of a capacitor portion of a semiconductor device obtained during a manufacturing process of the semiconductor device according to an embodiment of the present invention.

As shown in FIG. 1, an interlayer insulating film 2, such as an oxide film and the like, is formed on a silicon substrate 1. Thereafter, by using, for example, photolithography and etching, the interlayer insulating film 2 is selectively removed and a contact opening 3 is formed. The contact opening 3 is filled with conductor material, such as doped amorphous silicon and the like, and thereby a contact plug 4 is formed. Thereby, the structure shown in FIG. 1 is obtained.

Figure 2:
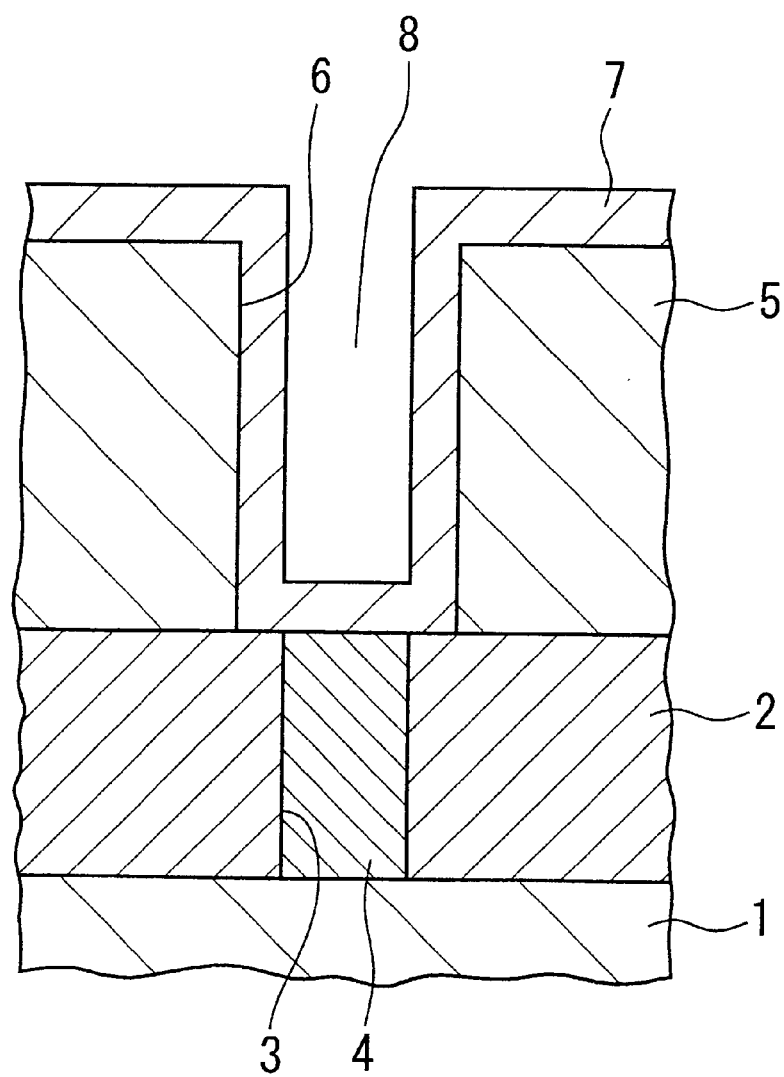
FIG. 2 is a partial cross sectional view illustrating another cross sectional structure of a capacitor portion of a semiconductor device obtained, after the structure of FIG. 1, during a manufacturing process of the semiconductor device according to an embodiment of the present invention.

Thereafter, on the contact plug 4 and on the interlayer insulating film 2, a relatively thick silicon oxide film 5 is formed. Then, by using, for example, photolithography and etching, the silicon oxide film 5 is selectively removed and thereby an opening 6 is formed. In this condition, the top surface of the contact plug 4 is exposed via the opening 6 and at the bottom of the opening 6. Next, a relatively thin phosphorus doped amorphous silicon film 7 is formed inside the opening 6, i.e., on the inside bottom surface and on an inner side wall of the opening 6, and on the silicon oxide film 5, by using a thermal CVD method. In this embodiment, a deposition temperature or a growth temperature of the phosphorus doped amorphous silicon film 7 is in a range from approximately 450 to approximately 520 degrees Celsius. Also, the thickness of the formed phosphorus doped amorphous silicon film 7 is, for example, between 600 through 1000 angstroms. Thereby, the structure shown in FIG. 2 is obtained.

Thereafter, a recessed portion or trench 8 formed or surrounded by the portion of the phosphorus doped amorphous silicon film 7 along the opening 6 is filled, for example, with coating glass, such as spin on glass and the like, or photo resist, not shown in the drawing. The phosphorus doped amorphous silicon film 7 is etched back. Then, the coating glass not shown in the drawing and the silicon oxide film 5 are removed by etching. Thereby, as shown in FIG. 3, a cylinder structure 9 made of the remainder of the phosphorus doped amorphous silicon film 7 can be obtained.

Figure 3:
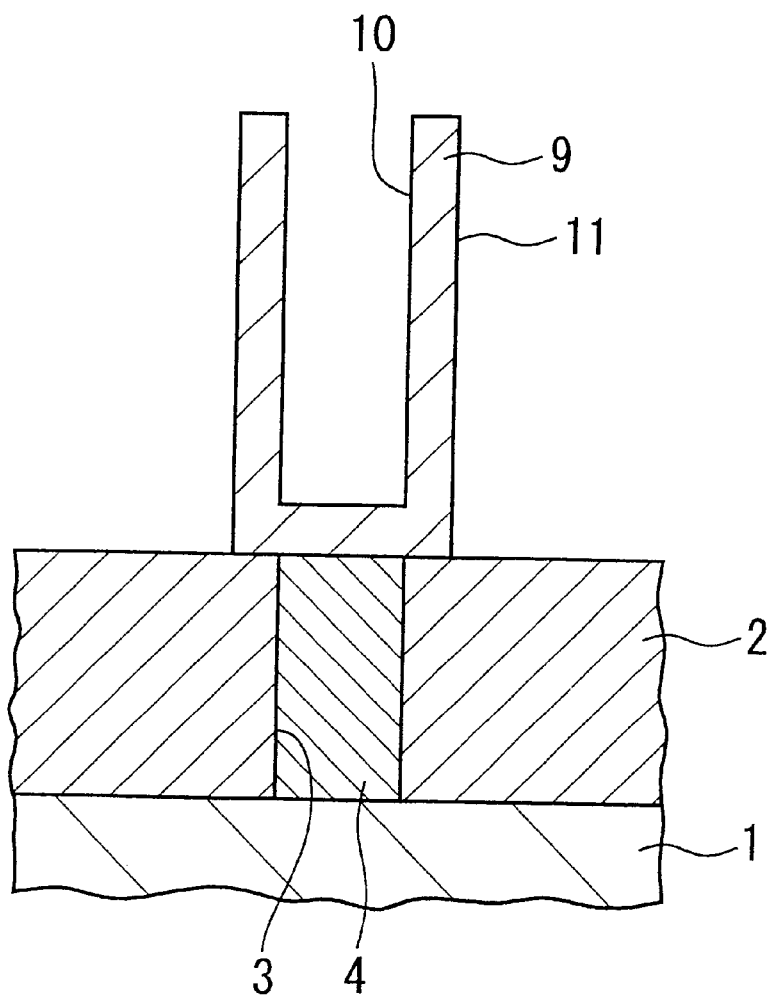
FIG. 3 is a partial cross sectional view illustrating still another cross sectional structure of a capacitor portion of a semiconductor device obtained, after the structure of FIG. 2, during a manufacturing process of the semiconductor device according to an embodiment of the present invention.
Figure 4:
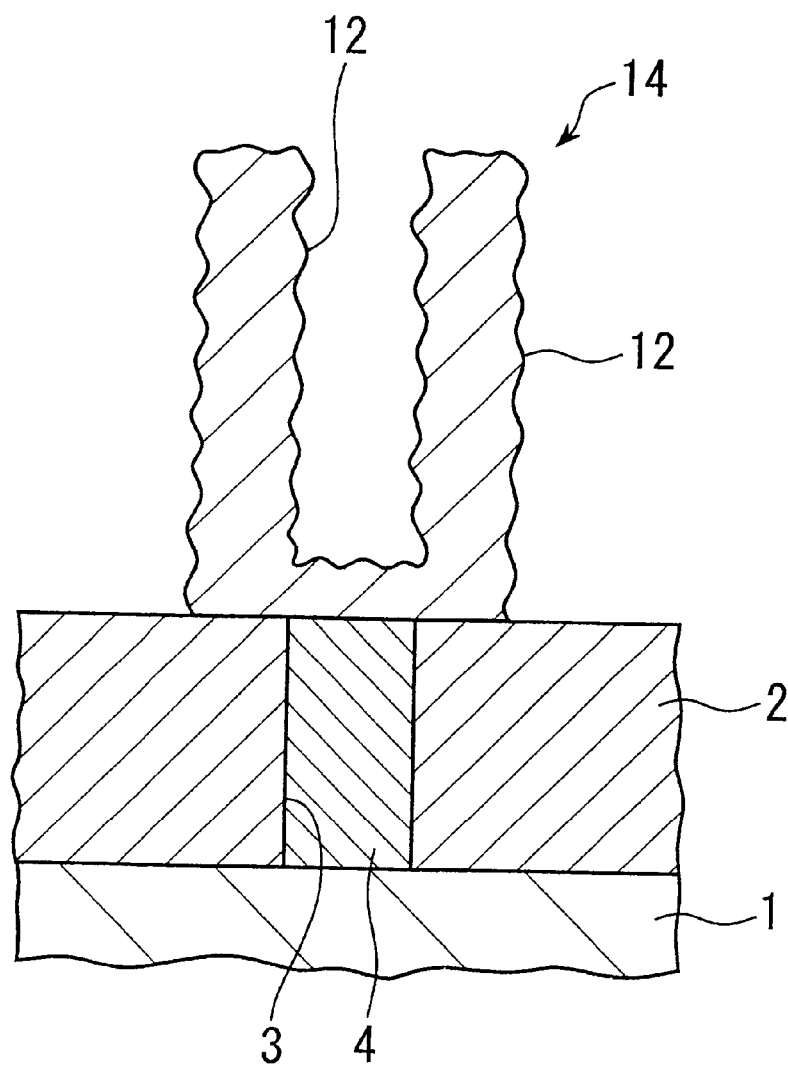
FIG. 4 is a partial cross sectional view illustrating still another cross sectional structure of a capacitor portion of a semiconductor device obtained, after the structure of FIG. 3, during a manufacturing process of the semiconductor device according to an embodiment of the present invention.

The substrate having the structure of FIG. 3 is loaded into an HSG forming apparatus not shown in the drawing. The atmosphere around the substrate is depressurized, and silane gas is introduced around the substrate. Thereafter, the atmosphere around the substrate is evacuated and the substrate is heat treated. Thereby, HSG or an HSG layer 12 is grown at the surface of the cylinder 9. As a result, an HSG cylinder 14 is fabricated as shown in FIG. 4.

Next, as a capacitor insulating film, a thin silicon nitride film 15, for example, is formed on the interlayer insulating film 2 and on the surface of the HSG cylinder 14 so as to coat the HSG cylinder 14. The silicon nitride film 15 has a thickness of, for example, 70 angstroms. Also, on the silicon nitride film 15, a phosphorus doped amorphous silicon film 16 is formed as an upper or outer electrode of the capacitor. Although not shown in the drawing, if necessary, the silicon nitride film 15 and the phosphorus doped amorphous silicon film 16 can be patterned by using photolithography and etching. Further, if necessary, portions constituted of the amorphous silicon, for example, the HSG cylinder portion 14, the phosphorus doped amorphous silicon film 16 and the like, can be crystallized by heat treating and the like, and can be changed to portions made of phosphorus doped polysilicon (polycrystalline silicon).

Figure 5:
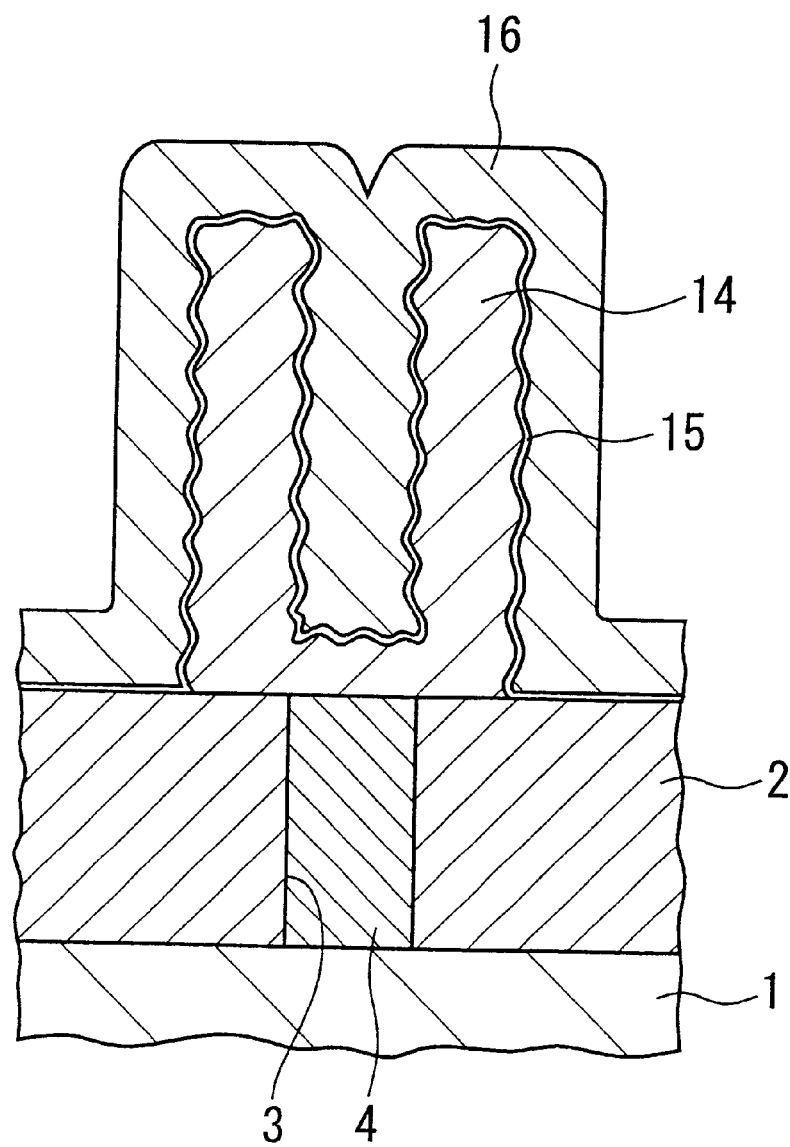
FIG. 5 is a partial cross sectional view illustrating still another cross sectional structure of a capacitor portion of a semiconductor device obtained, after the structure of FIG. 4, during a manufacturing process of the semiconductor device according to an embodiment of the present invention.

Thereby, as shown in FIG. 5, a capacitor structure comprising the lower electrode 14, the insulating film or dielectric film 15, and the upper electrode 16 can be fabricated. In FIG. 5, the lower electrode 14 is electrically coupled with the silicon substrate 1 via the contact plug 4. However, it is also possible to couple the lower electrode 14 to any conductor or semiconductor layer formed on or in the substrate 1, via, for example, the contact plug 4. Further, in the above, an explanation is made on the capacitor portion of a semiconductor device. However, it is possible to form any structure, such as a transistor and the like, adjacent the capacitor portion and to couple such structure to the capacitor portion.

In this embodiment, the phosphorus doped amorphous silicon film 7 was formed by the thermal CVD method which uses monosilane ($SiH_4$) and phosphine ($PH_3$), at a temperature within a range approximately between 450 degrees Celsius and 520 degrees Celsius. Monosilane is a material gas generally used for growing a silicon film. As mentioned before, when the phosphorus doped amorphous silicon film is grown at a growth temperature generally and conventionally used, that is, at 530 through 550 degrees Celsius, crystalline nuclei are produced in the vicinity of the interface between the phosphorus doped amorphous silicon film and the grounding oxide film. The crystalline nuclei causes the defect in the HSG structure formed thereafter. However, the inventor found that when the phosphorus doped amorphous silicon film 7 is formed at a growth temperature within a range approximately between 450 degrees Celsius and 520 degrees Celsius as in the present embodiment, the crystalline nuclei are not produced in the vicinity of the interface between the phosphorus doped amorphous silicon film 7 and the oxide films 2 and 5. Therefore, the growth rate of the HSG at the inner wall portion 10 of the cylinder 9 and the growth rate of the HSG at the outer wall portion of the cylinder 9 become substantially the same. As a result, the shape or profile of the HSG 12 at the inner wall portion of the HSG cylinder 14 and the shape or profile of the HSG 12 at the outer wall portion of the HSG cylinder 14 become substantially the same, and it becomes possible to considerably increase both the surface area of the inner wall portion and the surface area of the outer wall portion of the HSG cylinder 14.

Figure 6A:
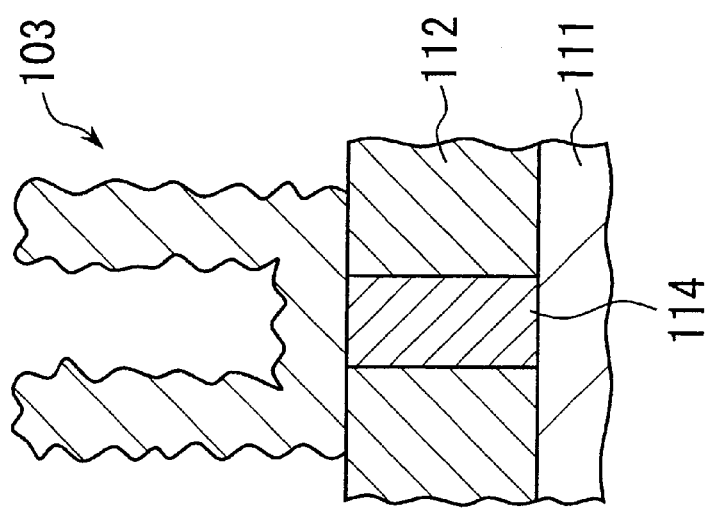
FIG. 6A is a partial cross sectional view schematically showing a structure of a simple stack type lower electrode of a capacitor used in a conventional semiconductor device.
Figure 6B:
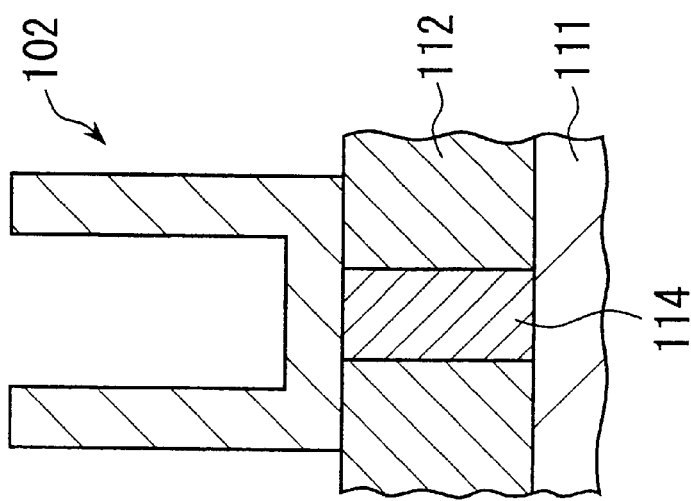
FIG. 6B is a partial cross sectional view schematically showing a structure of a cylinder type lower electrode of a capacitor used in a conventional semiconductor device.
Figure 6C:
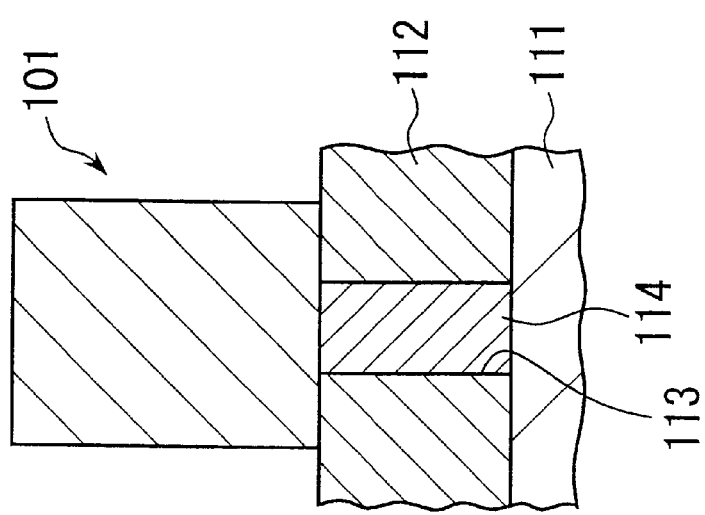
FIG. 6C is a partial cross sectional view schematically showing a structure of an ideal HSG cylinder type lower electrode of a capacitor used in a semiconductor device.

The value of the electrostatic capacitance of the capacitor actually manufactured in accordance with the method of this embodiment substantially coincided with the capacitance value expected from the ideal HSG cylinder type electrode 103 shown in FIG. 6C. That is, the capacitance value of the capacitor manufactured in accordance with the method of this embodiment was approximately 3.5 through 4 times the capacitance value of the capacitor using the simple stack type electrode 101.

When the phosphorus doped amorphous silicon film 7 is formed at a growth temperature of this embodiment, that is, at approximately 450 through 520 degrees Celsius, the deposition rate or the growth rate of the phosphorus doped amorphous silicon film becomes somewhat lower than that of the conventional method in which the phosphorus doped amorphous silicon film is formed at a growth temperature of 530 through 550 degrees Celsius. That is, the growth rate of the phosphorus doped amorphous silicon film 7 becomes equal to or smaller than approximately half of the conventional growth rate which is 25 through 50 angstroms per minute. However, since the thickness of the phosphorus doped amorphous silicon film 7 required for forming the cylinder is, for example, equal to or smaller than 1000 angstroms. Therefore, the growth rate of the phosphorus doped amorphous silicon film 7 according to the present embodiment does not give bad influence on the throughput of manufacturing of the semiconductor device.

It is also preferable to fabricate the phosphorus doped amorphous silicon film 7 as follows.

First, the growth temperature is controlled within a range approximately between 450 and 520 degrees Celsius, and a first relatively thin phosphorus doped amorphous silicon film having a thickness in a range approximately from 50 to 200 angstroms is formed, by the thermal CVD method, by using monosilane ($SiH_4$) and phosphine ($PH_3$) gases. Thereafter, the growth temperature is raised to approximately 530 through 550 degrees Celsius, and a second phosphorus doped amorphous silicon film is formed on the first phosphorus doped amorphous silicon film, by using the thermal CVD method, by using the similar gases, i.e., monosilane ($SiH_4$) and phosphine (PH3) gases. Thereby, the phosphorus doped amorphous silicon film 7 is formed which has a stacked structure or a double layer structure comprising the first and the second phosphorus doped amorphous silicon films and which has a final thickness of approximately 600 through 1000 angstroms.

In the phosphorus doped amorphous silicon film 7 having such a stacked structure, the region near the interface between the phosphorus doped amorphous silicon film 7 and the grounding oxide films, i.e., the oxide film 2 and 5 is constituted of the first phosphorus doped amorphous silicon film which is grown at a low temperature of approximately 450 through 520 degrees Celsius. Therefore, the crystalline nuclei are hardly produced. Thereafter, as the growth temperature of the phosphorus doped amorphous silicon film is raised approximately to 530 through 550 degrees Celsius during a process of forming the phosphorus doped amorphous silicon film 7, the growth rate of the phosphorus doped amorphous silicon film also becomes high. Therefore, it is possible to make the time period required for forming the phosphorus doped amorphous silicon film 7 shorter than that of the former embodiment. This also contributes to an improvement in the throughput of manufacturing a semiconductor device.

In the process of forming the phosphorus doped amorphous silicon film at a low growth temperature, that is, a at a temperature within a range approximately 450 through 520 degrees Celsius, by using the thermal CVD method, it is possible to use disilane ($Si_2H_6$) in place of monosilane ($SiH_4$). Disilane has a characteristic of decomposing at a lower temperature than the monosilane. Therefore, when the phosphorus doped amorphous silicon film is formed at a low temperature, that is, at a temperature within a range from approximately 450 to 520 degrees Celsius, it is possible to increase the growth rate of the phosphorus doped amorphous silicon film by using the disilane as a material gas. This also contributes to an improvement in the throughput of manufacturing a semiconductor device.

In this embodiment, it is also preferable to form the phosphorus doped amorphous silicon film 7 by using one of the following process steps.

(1) The phosphorus doped amorphous silicon film 7 is formed at a low temperature, for example, a temperature within a range from 450 to 520 degrees Celsius, by the thermal CVD method which uses ($SiH_4$+$PH_3$).

(2) In a first step, a relatively thin phosphorus doped amorphous silicon film is formed at a low temperature, for example, a temperature within a range from 450 to 520 degrees Celsius, by the thermal CVD method which uses ($SiH_4$+$PH_3$) or ($Si_2H_6$+$PH_3$). In the next step, the growth temperature is raised to a high temperature, for example, a temperature equal to or higher than 520 degrees Celsius and another phosphorus doped amorphous silicon film is formed, by the thermal CVD method which uses ($SiH_4$+$PH_3$), thereby forming the phosphorus doped amorphous silicon film 7 having two layer structure.

(3) The phosphorus doped amorphous silicon film 7 is formed at a low temperature, for example, a temperature within a range from 450 to 520 degrees Celsius, by the thermal CVD method which uses ($Si_2H_6$+$PH_3$).

(4) In a first step, a phosphorus doped amorphous silicon film is formed at a low temperature, for example, a temperature within a range from 450 to 520 degrees Celsius, by the thermal CVD method which uses at least $Si_2H_6$. In the next step, the growth temperature is raised to a high temperature, for example, a temperature equal to or higher than 520 degrees Celsius, and another phosphorus doped amorphous silicon film is formed, by the thermal CVD method which uses at least $SiH_4$, thereby forming the phosphorus doped amorphous silicon film 7 having two layer structure.

In the above-mentioned embodiment, phosphorus (P) is used as a dopant for forming the phosphorus doped amorphous silicon film 7. However, it is possible to use another dopant, for example, arsenic (As) in place of or in addition to phosphorus.

According to the present invention, it becomes possible to provide an HSG cylinder type electrode in which HSG is formed uniformly at the outer wall portion and the inner wall portion. Therefore, it is possible to further increase the area of the electrode, when compared with the electrode manufactured by using the prior art method. Also, according to the present invention, it is possible to form the capacitor electrode having the ideal HSG structure at the surface thereof and having large surface area, so that capacitance of the capacitor can be greatly increased. Further, there is substantially no influence on the time required for manufacturing such capacitor.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative sense rather than a restrictive sense, and all such modifications are to be included within the scope of the present invention. Therefore, it is intended that this invention encompasses all of the variations and modifications as fall within the scope of the appended claims.

What is claimed is:

1. A method of manufacturing a semiconductor device comprising:

forming a cylindrical type electrode body which is made of amorphous silicon and which has at least an inner wall surface and an outer wall surface, said step of forming a cylinder type electrode body including at least a first step of forming a first amorphous silicon film by using a thermal CVD method and a second step of forming a second amorphous silicon film on the first amorphous silicon film by using a thermal CVD method, wherein the growth temperature of the first amorphous silicon film in said first step is controlled to be within a first range of between 450 degrees and 520 degrees Celsius, and wherein the growth temperature of said second amorphous silicon film in said second step is controlled to be within a second range which is higher than said first range; and forming hemispherical grain (HSG) at least at said inner wall surface and at said outer wall surface of said cylinder type electrode body to form a hemispherically grained cylinder type electrode, wherein said first and second amorphous silicon films are doped amorphous silicon films.

2. A method of manufacturing a semiconductor device as set forth in claim 1, wherein said HSG cylinder type electrode is a lower or inner electrode of a capacitor.

3. A method of manufacturing a semiconductor device as set forth in claim 1, wherein said second step is performed substantially continuously after said first step.

4. A method of manufacturing a semiconductor device as set forth in claim 1, wherein, in said first step, said first amorphous silicon film is formed by using a thermal CVD method which uses at least disilane ($Si_2H_6$), and, in said second step, said second amorphous silicon film is formed on said first amorphous silicon film by using a thermal CVD method which uses at least monosilane ($SiH_4$).

5. A method of manufacturing a semiconductor device, comprising:

forming a cylindrical type electrode body which is made of amorphous silicon and which has at least an inner wall surface and an outer wall surface, said step of forming a cylinder type electrode body including at least a first step of forming a first amorphous silicon film by using a thermal CVD method and a second step of forming a second amorphous silicon film on said first amorphous silicon film by using a thermal CVD method, wherein the growth temperature of said first amorphous silicon film in said first step is controlled to be within a first range of between 450 degrees and 520 degrees Celsius, and wherein the growth temperature of said second amorphous silicon film in said second step is controlled to be within a second range which is higher than said first range; and forming hemispherical grain (HSG) at least at said inner wall surface and at said outer wall surface of said cylinder type electrode body to form a hemispherically grained cylinder type electrode, wherein, in said first step, said first amorphous silicon film is formed by using a thermal CVD method which uses disilane ($Si_2H_6$) and phosphine ($PH_3$), and, in said second step, said second amorphous silicon film is formed on said first amorphous silicon film by using a thermal CVD method which uses monosilane ($SiH_4$) and phosphine ($PH_3$).

6. A method of manufacturing a semiconductor device, comprising:

forming a cylindrical type electrode body which is made of amorphous silicon and which has at least an inner wall surface and an outer wall surface, said step of forming a cylinder type electrode body including at least a first step of forming a first amorphous silicon film by using a thermal CVD method and a second step of forming a second amorphous silicon film on said first amorphous silicon film by using a thermal CVD method, wherein the growth temperature of said first amorphous silicon film in said first step is controlled to be within a first range of between 450 degrees and 520 degrees Celsius, and wherein the growth temperature of said second amorphous silicon film in said second step is controlled to be within a second range which is higher than said first range; and forming hemispherical grain (HSG) at least at said inner wall surface and at said outer wall surface of said cylinder type electrode body to form a hemispherically grained cylinder type electrode, wherein, in said fist step, said first amorphous silicon film is formed by using a thermal VCD method which uses monosilane ($SiH_4$) and phosphine ($PH_3$), and, in said second step, said second amorphous silicon film is formed on said first amorphous silicon film by using a thermal CVD method which uses monosilane ($SiH_4$) and phosphine ($PH_3$).

7. A method of manufacturing a semiconductor device as set forth in claim 1, wherein said first amorphous silicon film is thinner than said second amorphous silicon film.

8. A method of manufacturing a semiconductor device, comprising:

preparing a semiconductor substrate;

forming a first insulating film on said semiconductor substrate;

forming a first opening in said first insulating film;

filling said first opening with an electrically conductive material;

forming a second insulating film on said first insulating film and on a portion of said electrically conductive material filling said first opening;

selectively removing said second insulating film and forming a second opening, wherein a top surface of said portion of said electrically conductive material filing said first opening is exposed through said second opening;

forming a doped amorphous silicon film on said second insulating film and on a side wall surface and a bottom surface of said second opening by using a thermal CVD method, while controlling at least an initial growth temperature of said doped amorphous silicon film to be within a range of from 450 through 520 degrees Celsius;

filling a recessed portion surrounded by a portion of said doped amorphous silicon film formed along said second opening with a masking material;

etching back said doped amorphous silicon film;

removing said second insulating film and said masking material filling said recessed portion surrounded b said doped amorphous silicon; and forming hemispherical grain (HSG) at least at an inner wall surface and at an outer wall surface of said doped amorphous silicon film which is left and which has a cylindrical shape to form an HSG cylinder type electrode, wherein said step of forming a doped amorphous silicon film includes:

forming a first doped amorphous silicon film using a thermal CVD method; and forming a second doped amorphous silicon film on said first doped amorphous silicon film using a thermal CVD method, and wherein a growth temperature of said first doped amorphous silicon film is controlled to be within a range from 450 to 520 degrees Celsius, and a growth rate of said second doped amorphous silicon film is controlled to be a temperature higher than 520 degrees Celsius.

* * * * *